(12) United States Patent  
Duong et al.

(10) Patent No.: US 9,245,848 B2  
(45) Date of Patent: Jan. 26, 2016

(54) METHODS FOR COATING A SUBSTRATE WITH AN AMPHIPHILIC COMPOUND

(71) Applicant: Intermolecular, Inc., San Jose, CA (US)

(72) Inventors: Anh Duong, Fremont, CA (US); Tony Chiang, Campbell, CA (US); Zachary M. Fresco, Santa Rosa, CA (US); Nitin Kumar, Fremont, CA (US); Chi-I Lang, Cupertino, CA (US); Jinhong Tong, Santa Clara, CA (US); Anna Tsizelmon, Mountain View, CA (US)

(73) Assignee: Intermolecular, Inc., San Jose, CA (US)

(*) Notice: Subject to any disclaimer, the term of this patent is extended or adjusted under 35 U.S.C. 154(b) by 0 days.

(21) Appl. No.: 14/488,712

(22) Filed: Sep. 17, 2014

(65) Prior Publication Data

US 2015/0001555 A1  Jan. 1, 2015

Related U.S. Application Data

(63) Continuation of application No. 13/971,613, filed on Aug. 20, 2013, now Pat. No. 8,871,860, which is a continuation of application No. 12/172,110, filed on Jul. 11, 2008, now Pat. No. 8,535,972.

(60) Provisional application No. 60/949,773, filed on Jul. 13, 2007, provisional application No. 60/949,798, filed on Jul. 13, 2007, provisional application No. 61/017,395, filed on Dec. 28, 2007.

(51) Int. Cl.
| | |
|---|---|
| H01L 23/48 | (2006.01) |
| H01L 23/532 | (2006.01) |
| H01L 21/02 | (2006.01) |
| H01L 21/3105 | (2006.01) |
| H01L 21/768 | (2006.01) |
| C09D 129/04 | (2006.01) |

(52) U.S. Cl.
CPC .......... *H01L 23/5329* (2013.01); *C09D 129/04* (2013.01); *H01L 21/02063* (2013.01); *H01L 21/02074* (2013.01); *H01L 21/3105* (2013.01); *H01L 21/31058* (2013.01); *H01L 21/7682* (2013.01); *H01L 21/76814* (2013.01); *H01L 21/76826* (2013.01); *H01L 21/76829* (2013.01); *H01L 2221/1063* (2013.01); *H01L 2924/0002* (2013.01)

(58) Field of Classification Search
None
See application file for complete search history.

(56) References Cited

U.S. PATENT DOCUMENTS 7,902,064 B1 * 3/2011 Chiang et al. ................. 438/627

* cited by examiner

*Primary Examiner* — Jack Chen

(57) ABSTRACT

Methods of modifying a patterned semiconductor substrate are presented including: providing a patterned semiconductor substrate surface including a dielectric region and a conductive region; and applying an amphiphilic surface modifier to the dielectric region to modify the dielectric region. In some embodiments, modifying the dielectric region includes modifying a wetting angle of the dielectric region. In some embodiments, modifying the wetting angle includes making a surface of the dielectric region hydrophilic. In some embodiments, methods further include applying an aqueous solution to the patterned semiconductor substrate surface. In some embodiments, the conductive region is selectively enhanced by the aqueous solution. In some embodiments, methods further include providing the dielectric region formed of a low-k dielectric material. In some embodiments, applying the amphiphilic surface modifier modifies an interaction of the low-k dielectric region with a subsequent process.

15 Claims, 11 Drawing Sheets

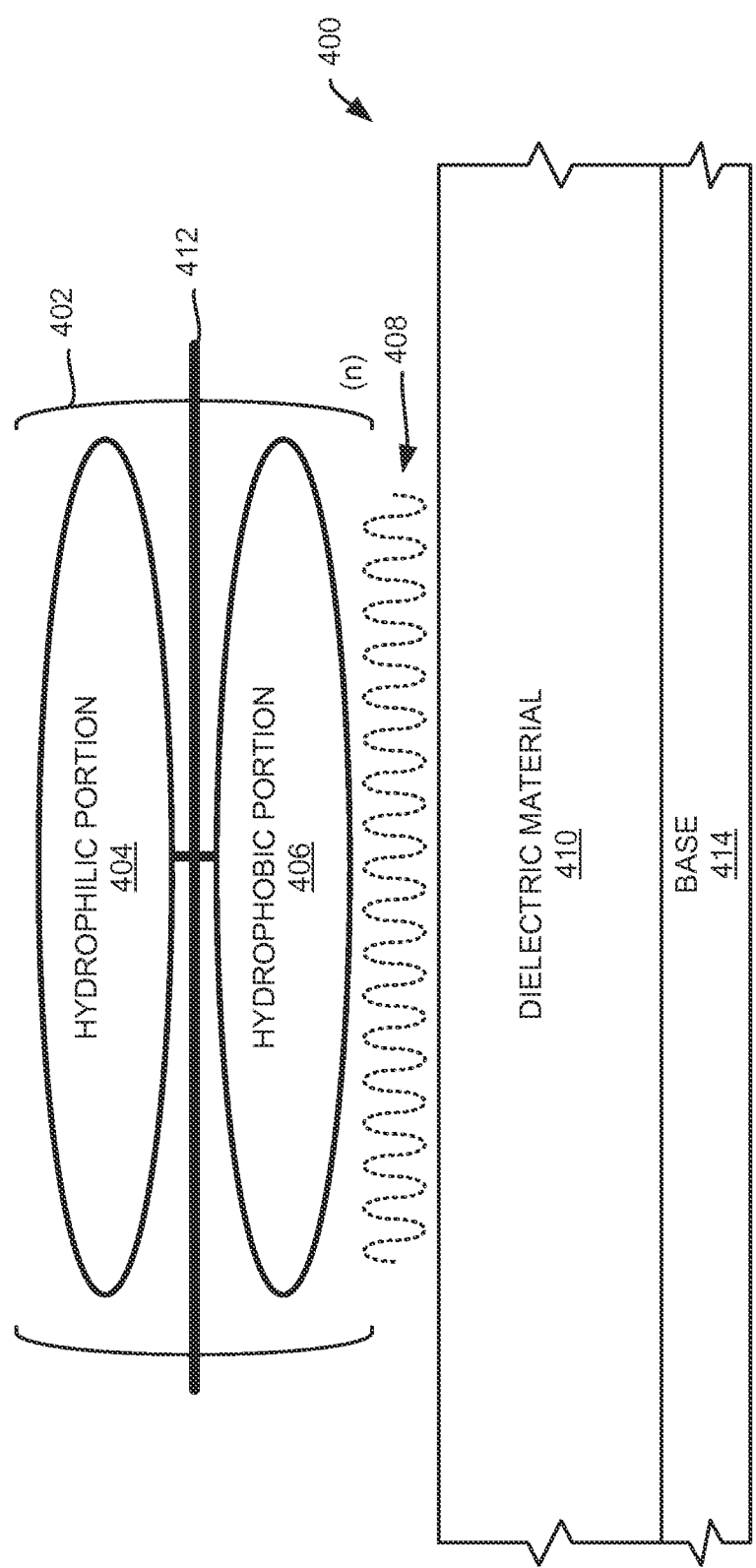

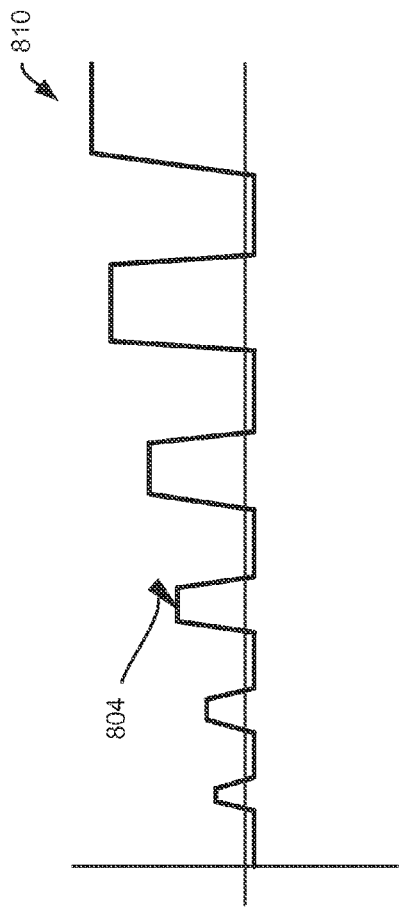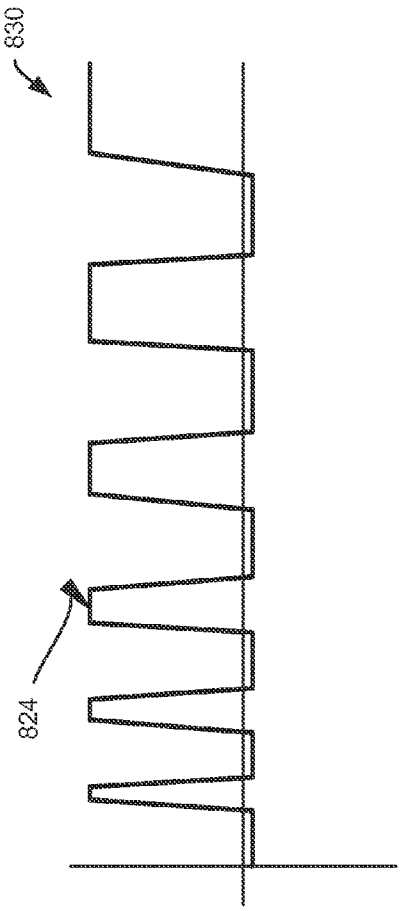
FIG. 8A
FIG. 8B
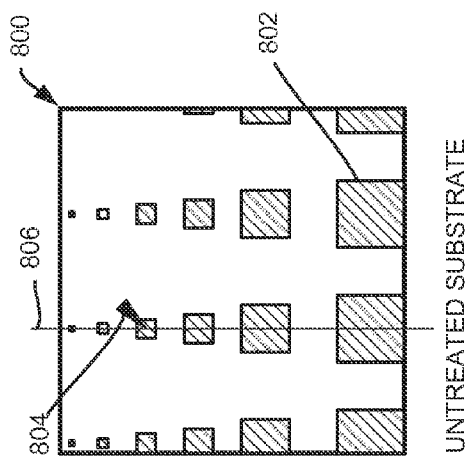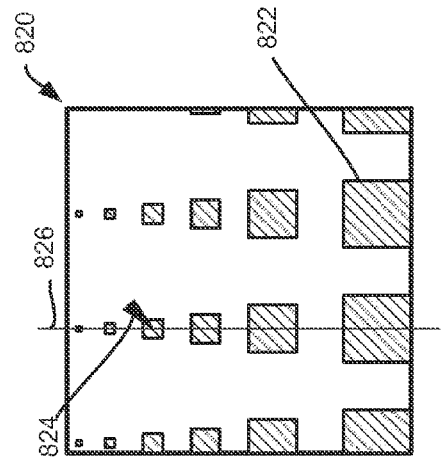

METHODS FOR COATING A SUBSTRATE WITH AN AMPHIPHILIC COMPOUND

PRIORITY CLAIM TO PROVISIONAL APPLICATION

This is a Continuation of U.S. patent application Ser. No. 13/971,613, filed on Aug. 20, 2013, which is a Continuation of U.S. patent application Ser. No. 12/172,110, filed on Jul. 11, 2008; which claims priority under the provisions of 35 U.S.C. §119 to U.S. Provisional Application No. 60/949,773, filed on Jul. 13, 2007; and to U.S. Provisional Application No. 60/949,798, filed on Jul. 13, 2007; and to U.S. Provisional Application No. 61/017,395, filed on Dec. 28, 2007, each of which is incorporated herein by reference for all purposes.

BACKGROUND

The semiconductor industry is increasingly moving to substrates comprising low-k dielectric materials in order to achieve continued scaling of microelectronic devices. Low-k dielectric materials are characterized by having a low dielectric constant relative to silicon dioxide, a common dielectric material. As microelectronic devices become smaller, the amount of dielectric material isolating conductive areas becomes correspondingly smaller. In some conventional examples utilizing silicon dioxide, thinning dielectric material may result in capacitive effects, cross-talk effects, and other undesirable effects that adversely affect device performance. Replacing silicon dioxide with low-k dielectric material of like thickness may reduce or eliminate these detrimental effects.

Use of low-k dielectric materials, however, is not a panacea. For example, some portions of low-k dielectric materials (e.g., trace $NH_{(x)}$ groups), may adversely affect chemistries of subsequent substrate processing. In addition, many low-k dielectric materials lack functional groups, which may be required for covalent chemistry. Furthermore, low-k dielectric materials are characteristically hydrophobic, which makes surfaces of low-k dielectric materials difficult to wet. In some examples, this hydrophobic characteristic may inhibit or altogether prevent aqueous (wet) processing steps from reacting with conductive regions (i.e., copper lines) that may be located directly adjacent with hydrophobic low-k dielectric materials. Some aqueous steps may include: aqueous cleaning steps, metallization steps, and other similar wet steps. While a hydrophobic characteristic may be problematic for featureless substrates, it is especially problematic for substrates having narrow topographical features such as vias and trenches.

For example, surface characteristics of patterned substrates, as may be appreciated, may present challenges to process integration in a manufacturing context. Where wet chemistries are utilized, a hydrophobic dielectric surface having a high wetting angle characteristic may adversely affect adjoining conductive surfaces targeted by the wet chemistries. FIG. 1A is a prior art illustrative cross-sectional view of a portion of a substrate 100A having a base layer 105A, conductive regions 110A, and dielectric regions 120A with arrows 150A illustrating hydrophobic forces at the surface of the dielectric regions 120A. The arrows 150A illustrated in FIG. 1A illustrate the outward force of the hydrophobic properties of the low-k dielectric in dielectric regions 120A. Hydrophobic properties may present challenges in process integration when utilizing aqueous semiconductor processes. In particular, when features are densely integrated having dielectric regions closely interleaved with conductive regions, dielectric regions having hydrophobic properties may hinder or altogether prevent aqueous reactions along conductive regions. One possible adverse result due to hydrophobic characteristics is that deposition rates may not be uniform or, in some example, may fail entirely on smaller more isolated features. Non-uniform thicknesses of deposited layers or failure to deposit layers may cause integration problems during subsequent semiconductor processing as well as performance problems (e.g., increased resistance in thinner depositions) when using a finished device.

FIG. 1B is a prior art illustrative cross-sectional representation of an untreated substrate 100B after a wet deposition process. As illustrated, substrate 100B may include a base layer 105B, dielectric regions 120B, and conductive regions 110B and 112B. A single layer is illustrated, but embodiments provided herein may equally apply to one or many layers without departing from the present invention. In some embodiments, substrate 100B may include an electronic device and may be made, in whole or in functionally significant part, of semiconductor material or materials. As illustrated, conductive regions 110B and 112B and dielectric regions 120B are formed over base 105B, which may be conductive in some embodiments. Thus, for example, conductive regions 110B and 112B may form interconnections between base 105B and other electrically conductive materials subsequently formed as part of substrate 100B. Further, as illustrated, dielectric regions 120B represent areas having hydrophobic characteristics as indicated by arrows 150B. Hydrophobic characteristics may present challenges in process integration when using aqueous semiconductor processes. In particular, when features are densely integrated having dielectric regions closely interleaved with conductive regions, or when features are small or isolated, dielectric regions having hydrophobic characteristics may hinder or altogether prevent aqueous reactions along conductive regions. Thus, one result of these hydrophobic characteristics is that depositions 114B and 116B may not have a uniform thickness, as illustrated, or may not even occur on the smaller more isolated features. Non-uniform thicknesses of deposited layers or failure to deposit may cause integration problems during subsequent semiconductor processing as well as performance problems (e.g., increased resistance in the thinner deposition 116B) when using a finished device. It should be noted that the illustrated thicknesses are not drawn to scale and should not be construed as limiting with respect to scale or proportion.

In other examples, at least some low-k dielectric materials are porous. Porous low-k dielectric materials may, in some examples, trap unwanted materials (such as particles, solvents, etc. . . . ) that may adversely affect dielectric properties. During processing, dielectric surfaces may be subjected to undesirable penetration of damaging process chemistries into underlying dielectric regions. In some cases, capacitance of the dielectric region may be adversely affected. The low-k dielectric material may be physically damaged, degraded, or chemically altered in such a way that the dielectric constant of the material is increased. For example, one class of process chemistries which are particularly reactive with dielectric materials are surfactants. Surfactants, as may be appreciated, are wetting agents that may be utilized to lower the surface tension of a liquid and to allow easier spreading thus improving reactivity of aqueous chemistries. However, surfactants may also have damaging effects. In some examples a dielectric constant of a low-k dielectric material may be temporarily or permanently altered. As may be appreciated, porous low-k dielectric materials include pores that function to lower the dielectric constant of a dielectric material. Certain processing materials such as surfactants may enter and fill the pores of the dielectric material changing the dielectric constant of the dielectric.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4 is an illustrative representation of an amphiphilic molecule formed on a dielectric region of a substrate in accordance with embodiments of the present invention;

FIGS. 8A-B are illustrative representations of an untreated substrate and treated substrate and accompanying graphical representation of atomic force microscope (AFM) scan in accordance with embodiments of the present invention;

DETAILED DESCRIPTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Embodiments of the current invention describe a surface modifier to modify low dielectric constant materials. It is becoming increasingly desirable to use low dielectric constant (k), or "low-k" dielectric materials in the manufacture of microelectronic devices to, for example, provide a reduction in capacitive and cross-talk effects. A low-k dielectric material is one having a dielectric constant of lower than 3.9. The surface of the low-k dielectric can be modified to improve its interaction with subsequent solutions applied to the surface. In one embodiment, the surface of the low-k dielectric is modified to improve the wettability of the low-k dielectric material to an aqueous solution. In another embodiment, the surface of a porous low-k dielectric material is modified to seal the pores to prevent the diffusion of chemistries or materials into the pores. Embodiments of inventive surface modifiers are also disclosed as well as methods of using those surface modifiers.

Figure 1A:
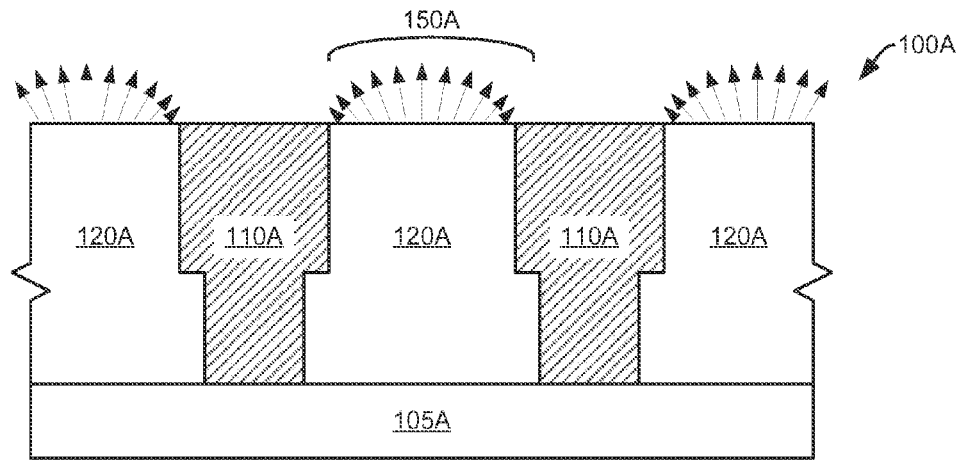
FIGS. 1A-B, are prior art illustrative cross-sectional views of a portion of a substrate having a base layer, conductive regions, and dielectric regions.
Figure 1B:
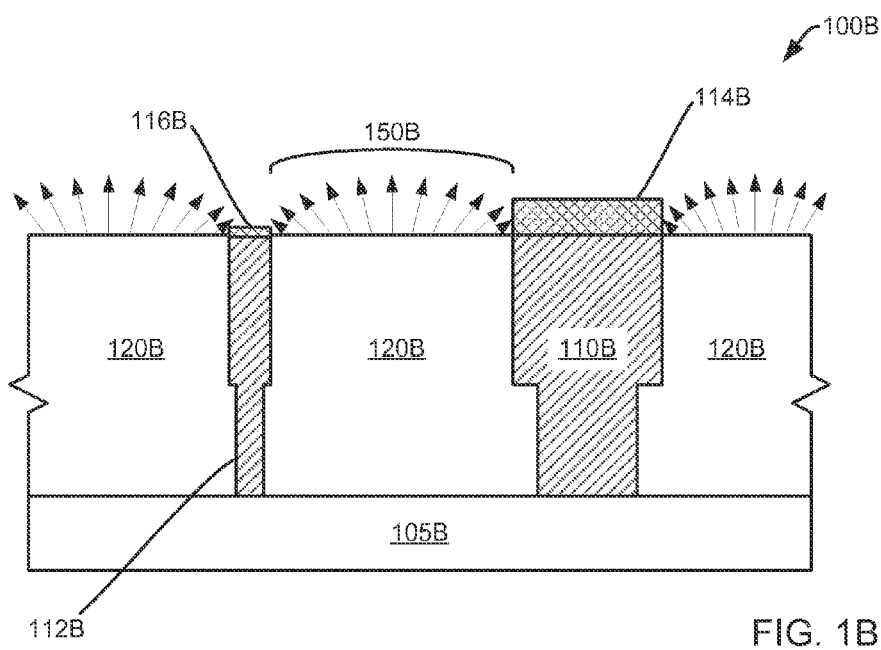
Figure 2:
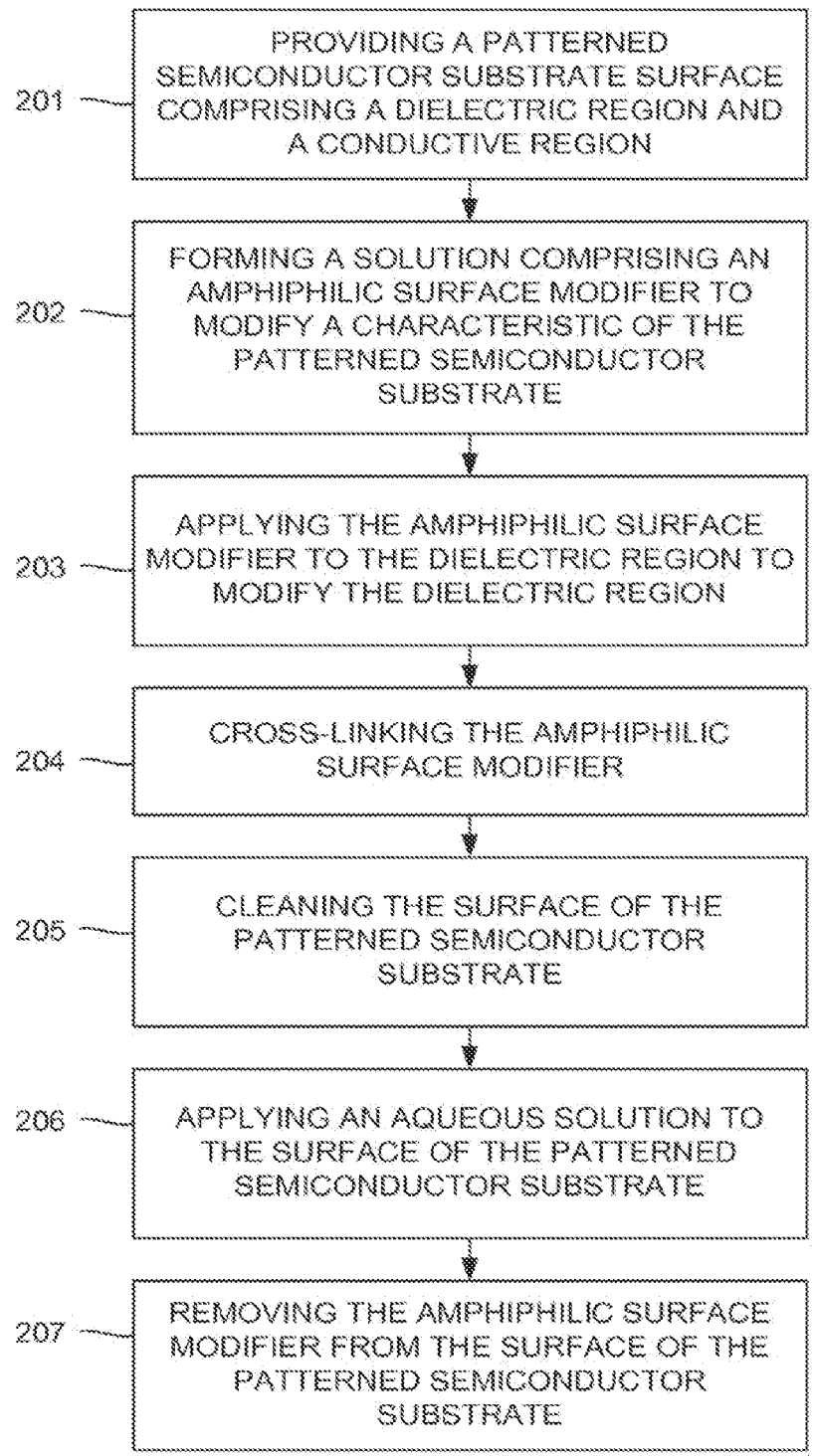
FIG. 2 is an illustrative flowchart of methods for modifying a substrate in accordance with embodiments of the present invention.
Figure 3A:
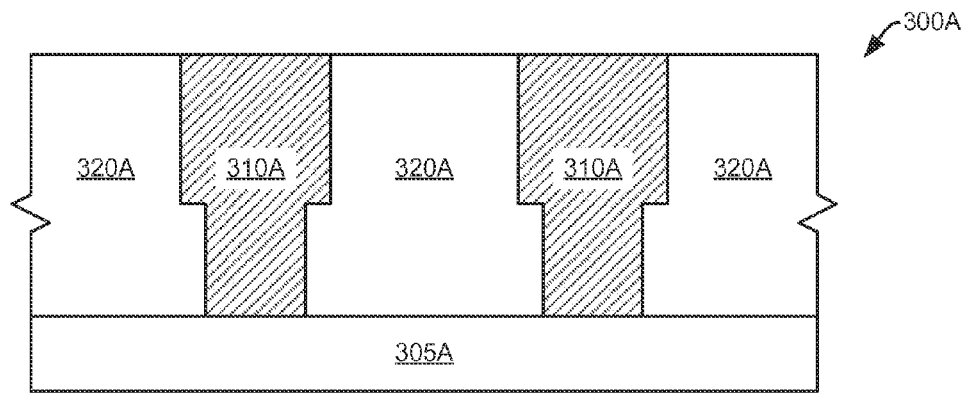
FIGS. 3A-C, are illustrative cross-sectional views of a portion of a substrate having a base layer, conductive regions, and dielectric regions in accordance with embodiments of the present invention.

FIG. 2 is an illustrative flowchart of methods for modifying a substrate in accordance with embodiments of the present invention. At block 201 of FIG. 2, the method provides a patterned semiconductor substrate surface comprising a dielectric region and a conductive region. An example patterned substrate is illustrated in FIG. 3A, which is an illustrative cross-sectional view of a portion of a substrate 300A having a base layer 305A, conductive regions 310A, and dielectric regions 320A in accordance with embodiments of the present invention. Embodiments may include any number of layers or regions in any configuration without departing from the present invention. In some embodiments, conductive regions 310A may be formed from copper, aluminum, and copper alloys such as copper-zinc alloys, copper-calcium alloys, and copper-manganese alloys, or some combination thereof without departing from the present invention. In addition, dielectric regions 320A may be formed from a low-k dielectric material that is formed from a doped or otherwise modified silicon dioxide-based material ($SiO_2$) or other dielectric materials without departing from the present invention. The dielectric constant of $SiO_2$ (3.9) can be lowered by utilizing methods such as doping with fluorine to produce fluorinated silica glass (FSG), which has a dielectric constant of 3.5. In some embodiments, other low-k dielectric materials may include: $SiCN$, $SiCNH$, $SiCH_3$, $SiOCH_3$, $SiCOH$, porous $SiCOH$, $SiN$, $SiC$, $SiO_2$, methyl-silsesquioxane (MSQ), SiLK dielectric by Dow Chemical, parylene, organic low-k polymers, and other similar materials. Additionally, dielectric regions may include a hard mask layer (not shown) at the surface of the low-k dielectric regions, which is often formed of a silicon-based material like $SiC_x$, $SiN_x$, $SiC_xN_y$, etc., where the variables x and y represent values as appropriate to desired compositions. The low-k dielectric materials are hydrophobic to different extents. For example, the low-k dielectric material may include methyl ($-CH_3$) or ethyl ($-C_2H_5$) groups, for example, that increase the hydrophobic nature of the substrate as illustrated by the arrows 150A in FIG. 1A.

Returning to FIG. 2, at block 202 the method forms a solution comprising an amphiphilic surface modifier. The amphiphilic surface modifier may be a polyvinyl alcohol (PVA), an amphiphilic macromolecule, a modified starch compound, a protein compound, a diblock copolymer, a triblock copolymer, or a dendrimers. As utilized herein, amphiphilic is a term describing a chemical compound possessing both hydrophilic and hydrophobic properties. The amphiphilic surface modifiers can also be tailored to have certain chemical properties and size for different applications. For example, because the surface modifier is amphiphilic, the solution may be formulated to adjust the wetting angle of a surface. In other embodiments, the amphiphilic surface modifier may be selected to be relatively large molecules (macro-molecules) to block pores and to prevent or minimize diffusion of any wet process compounds into blocked pores. In yet another embodiment, amphiphilic compounds may be utilized to protect porous low-k dielectric materials from subsequent processes.

Figure 3B:
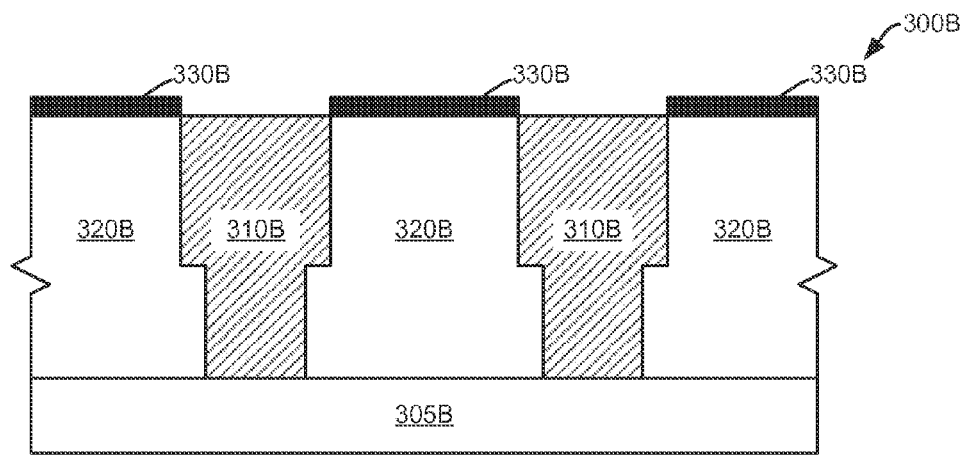

Referring to FIG. 3B, in embodiments, hydrophobic low-k dielectric regions 320B may be modified by the application of a formulation that includes an amphiphilic surface modifier resulting in a surface having hydrophilic characteristics. In one embodiment, amphiphilic surface modifier 330B comprises a PVA surface modifier that is applied to substrate 300B in an aqueous application step. PVA is a water-soluble synthetic polymer that features advantageous film forming, emulsifying, and adhesive properties. Amphiphilic surface modifiers can be selective to the dielectric regions 320B depending upon composition and process times. Amphiphilic compositions may be selected that do not generally adhere to conductive (e.g., copper) surfaces, but instead adhere selectively to hydrophobic dielectric surfaces. In other embodiments, however, an amphiphilic surface modifier may be non-selectively formed on both dielectric regions and to conductive regions. In some embodiments, PVA compounds containing thiol (e.g. polyvinyl mercaptan) or amine (e.g. polyvinylamine) functionality will adhere non-selectively with conductive regions as well as dielectric regions. In a non-selective example, an amphiphilic layer formed on a conductive region may require removal before subsequent aqueous processes. In embodiments, amphiphilic layers may be further composed of amphiphilic macromolecules, modified starch compounds, protein compounds, diblock copolymers, triblock copolymers, and dendrimers in any combination without departing from the present invention.

In order to formulate an amphiphilic PVA surface modifier, PVA may be first dissolved in water at a sufficiently high temperature (e.g., 25 to 90° C.) to prepare an aqueous PVA solution. As described above, other amphiphilic compounds, such as starches, may also be used in addition to or instead of PVA. Once a PVA solution is fully dissolved, the PVA solution may be allowed to cool to approximately room temperature before application. The concentration of the PVA solution and the process parameters related to the reaction process, such as time of formation (reaction period) prior to rinsing, temperature of solution, pH of solution, and so on, depend generally upon the requirements of the processing steps to which a substrate is subjected. In some embodiments, a PVA solution may be prepared having a concentration in the range of approximately 1 to 500 mM, more preferably 25 to 100 mM. It should be noted that the example concentrations (e.g., 25 mM) are stated with respect to monomer units, and not with respect to entire molecules of length, n. Thus, a particular molecular weight of an amphiphilic compound may be selected to address particular semiconductor processing steps and circuit geometries.

Unlike most vinyl polymers, PVA is not prepared by polymerization of a corresponding monomer. The monomer, vinyl alcohol, almost exclusively exists as the tautomeric form, acetaldehyde. PVA instead is prepared by partial or complete hydrolysis of polyvinyl acetate to remove acetate groups. For embodiments in which an amphiphilic surface modifier comprises PVA, fully hydrolyzed PVA may be used. Without being bound by theory, the percentage of hydrolysis may affect how strongly a PVA compound may attach with a surface. It is theorized that higher levels of hydrolysis may result in stronger attachment by a PVA compound with a dielectric surface. However, depending upon the application, the amount of hydrolysis can also be changed, for example from 75% to 100% hydrolyzed PVA. In some embodiments, an amphiphilic PVA surface modifier that is not fully hydrolyzed may include polyvinyl acetate. It is understood, however, that any amount of hydrolysis may be utilized without departing from the present invention. PVA may also be fully or partially functionalized with a desired functional group, such as thiols (—SH) or amines (—NH). For example, thiols can be used to grow metals on the PVA surface. Once a PVA solution is fully dissolved, the PVA solution may be allowed to cool down to approximately room temperature before application.

In some embodiments, PVA and cationic starches may be selected to form an amphiphilic layer for at least the following reasons: these amphiphilic compounds do not chemically react with low-k dielectric materials; these amphiphilic compounds are water soluble; and these amphiphilic compounds may be readily removed in a high temperature (e.g., greater than 80° C.) rinsing step. It may be noted that although subsequent discussion may be directed to amphiphilic surface modifiers composed of PVA, it should be noted that such discussion applies equally to other amphiphilic compounds such as: starches, modified starches (e.g., cationic, anionic), proteins, and other similar compounds that can render a hydrophobic surface hydrophilic without departing from the present invention. Additionally, mixtures of PVA and starches may be utilized in any combination without departing from the present invention.

In some embodiments, PVA may further be co-polymerized with other polymers, which may provide additional protection for some process chemistries. Co-polymers may include: co-ethylene, co-cation, co-siloxane, co-anion (88% hydrolyzed), and co-anion (80% hydrolyzed). Without being bound by theory, it is proposed that a co-polymer complex may form a more robust covalent bond with surface groups on the dielectric material. Copolymerization may, in some embodiments, be utilized to tailor a surface modification layer to protect the low-k dielectric layer from particular chemistries of solutions applied in subsequent processing. For example a PVA-co-siloxane surface modification layer can prevent the degradation of a low-k dielectric layer during a post-CMP cleaning step where a non-fluorinated, high performance copper/low-k CMP cleaning solution such as CoppeReady CP72B by Air Products and Chemicals, inc. of Allentown, Pa. is used.

In addition, the molecular weight of PVA may be tailored to specific processing needs (or pore size). Accordingly, amphiphilic compounds for use with non-porous low-k dielectric materials may be small molecular compounds (for example, having a molecular weight in the range of 5 to 200 kiloDaltons (kDa). Amphiphilic compounds for use with porous low-k dielectric materials may be macro-molecular compounds. For example, depending on a pore size of a low-k dielectric material, PVA may be tailored to have a molecular weight in the range of approximately 5 to 500 kDa. In a preferred embodiment, a 25 mM with respect to monomer solution of a PVA compound having a molecular weight in a range of approximately 13-23 kDa where the PVA compound is 99% hydrolyzed. In addition, for substrates having topographical features that include vias and trenches, a PVA layer formed on a low-k dielectric material in accordance with embodiments provided herein, may enhance post via etch cleaning processes by enabling cleaning solutions to clean otherwise unreachable residues from via bottoms. Further aspects of amphiphilic surface modifiers will be discussed in further detail below for FIGS. 4-7.

In some embodiments, prior to applying the surface modifier on the exposed surfaces of the substrate (such as substrate 300A, FIG. 3A), the substrate surface may be prepared for processing in a preparation process that contains at least one or more cleaning steps (e.g., a deionized water rinse and/or any of a variety of other well-known surface cleaning step(s))

to remove contaminants left from previous processing. In one embodiment, the substrate 200 may be cleaned with deionized water for 30 s. Alternatively, the application and rinsing of the surface modification solution layer may itself constitute a cleaning step that prepares the substrate for a subsequent aqueous process step.

Returning to FIG. 2, at a block 203 an amphiphilic surface modifier is applied to the surface of the low-k dielectric material 320A of the substrate 300A. An amphiphilic surface modifier solution may be applied to the surface of a substrate in any manner known in the art without departing from the present invention. Generally, an amphiphilic surface modifier solution is applied to an entire surface of a substrate. In embodiments, a PVA surface modifier will generally only adhere to hydrophobic dielectric regions. In some embodiments, an amphiphilic surface modifier solution may selectively adhere to dielectric regions of a substrate and not to conductive regions, thus conditioning dielectric surfaces. In selective applications, to the extent that any stray amphiphilic material adheres to conductive regions, such material may be removed in a subsequent step. After application, the amphiphilic surface modifier solution is allowed to react with the substrate surface for a selected reaction period to form an amphiphilic surface modifier layer 330B over the dielectric regions 320B as illustrated in FIG. 3B, which is an illustrative cross-sectional representation of surface modified substrate 300B after applying an amphiphilic surface modifier in accordance with embodiments of the present invention. As illustrated, substrate 300B may include a base layer 305B, dielectric regions 320B, and conductive regions 310B and 312B. As above, conductive regions 310B and 312B and dielectric regions 320B are formed over base 305B, which may be conductive in some embodiments. Thus, for example, conductive regions 310B and 312B may form interconnections between base 305B and other electrically conductive materials subsequently formed as part of substrate 300B. Substrate 300B includes layer 330B, which attaches with dielectric region or surface 320B. Layer 330B may be a PVA surface modifier (optionally removable) or other amphiphilic surface modifiers, such as cationic starches, protein compounds, diblock copolymers, triblock copolymers, dendrimers, and amphiphilic macromolecules can be used in any combination, or additionally in combination with PVA. Layer 330B is preferably an amphiphilic surface modifier used to increase a hydrophilicity of the substrate 300B. Layer 330B reduces the contact angle of the surface of the dielectric region 320B, thereby increasing the hydrophilic nature of the substrate 300B allowing better access of aqueous processes to the conductive region 312B and 314B.

In this illustration the amphiphilic surface modifier selectively deposits on only the dielectric regions 320B, but the deposition may also be non-selective. In some embodiments, a selected reaction period is less than approximately 300 seconds (s), and more preferably less than approximately 120 s. In some embodiments, a selected reaction temperature is less than approximately 100° C., more preferably less than approximately 80° C. Layers comprising other amphiphilic surface modifiers may require different reaction periods for reacting amphiphilic layers. The thickness of the layer may also be selected in accordance with requirements of a processing system. In general, the amphiphilic surface modifier may be formed in a layer of any thickness and typically ranges from 5 to 50 Angstroms (Å), more preferably 20 to 35 Å. In some embodiments, for example when the amphiphilic surface modifier comprises PVA, the amphiphilic surface modifier is very thin layer, on the order of 20 to 35 Å. Therefore, in these embodiments, the amphiphilic surface modifier may or may not be removed after subsequent aqueous processing, since a thin layer may not affect further processing or the final semiconductor device.

In order to more fully clarify embodiments of the present invention, FIG. 4 illustrates a representation of an amphiphilic molecule formed on a dielectric region of a substrate in accordance with embodiments of the present invention, amphiphilic molecule 402 is formed on the surface of dielectric material 410. Amphiphilic molecule 402 contains hydrophilic portion 404 and hydrophobic portion 406 connected along backbone 412. It may be appreciated that backbone 412 represents a connective bond and may include additional functional groups without limitation and without departing from the present invention.

As illustrated, any number of molecules (n) may comprise a polymeric amphiphilic layer. In one embodiment, a hydrophilic portion of a PVA molecule includes a number of —OH functional groups, which account for the hydrophilic nature of the molecule. In embodiments, a hydrophobic portion of a PVA molecule may weakly bond with the surface of dielectric material 410 as illustrated by bonding force 408. Furthermore, hydrophobic portions 406 do not readily attach with conductive surfaces (not shown) in some embodiments and, as such, amphiphilic compounds may be selected to selectively adhere with dielectric surfaces. As may be seen, when amphiphilic molecule 402 is attached with surface of dielectric material 410, hydrophilic portion 404 of amphiphilic molecule 402 is oriented to provide an exposed hydrophilic surface. Amphiphilic molecule 402 may bond with dielectric surface through any theoretically possible means including chemical bonding, physical bonding or any other mechanism or force without departing from the present invention. In this manner, an amphiphilic molecule may effectively lower the wetting angle of dielectric material 310 surface thus facilitating aqueous processing of adjacent conductive surfaces.

Figure 5:
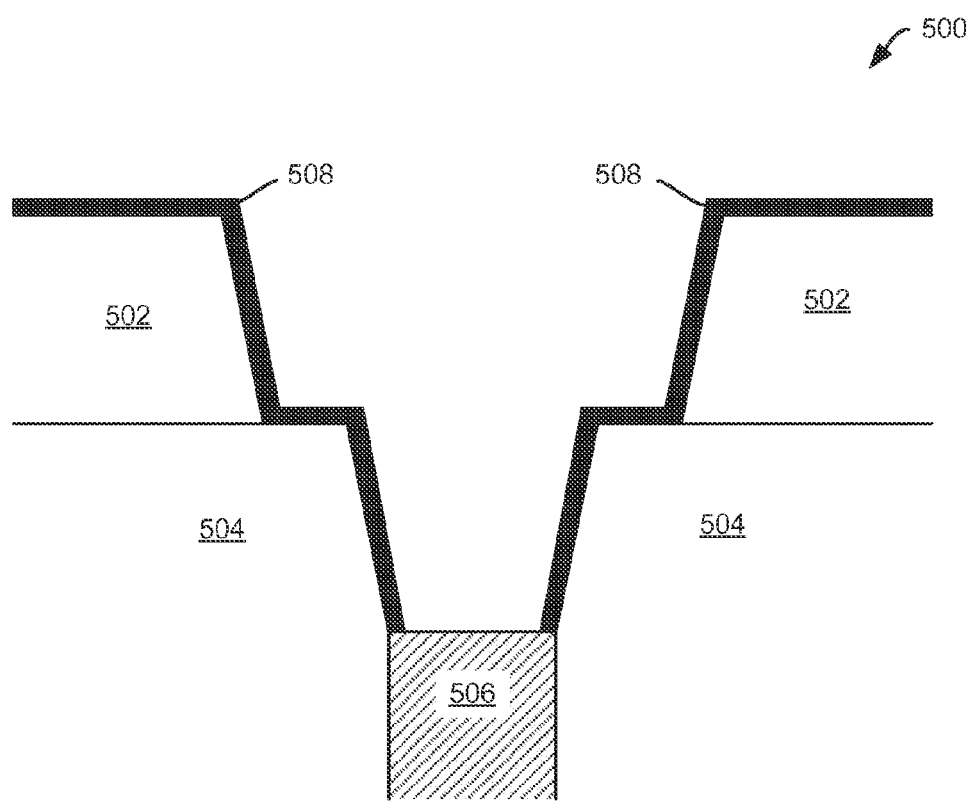
FIG. 5 is an illustrative cross-sectional view of a portion of a substrate having an electrically conductive region, at least two different dielectric regions and, a formed amphiphilic layer in accordance with embodiments of the present invention.

In another embodiment, FIG. 5 is an illustrative cross-sectional view of a portion of an alternate substrate 500 having an electrically conductive region 506, at least two different dielectric regions 502 and 504, and an amphiphilic surface modifier layer 508 in accordance with embodiments of the present invention. For substrates having topographical features that include vias and trenches, an amphiphilic surface modifier layer formed on a low-k dielectric material or multiple dielectric materials in accordance with embodiments provided herein, may enhance post via etch cleaning processes by enabling cleaning solutions to clean otherwise unreachable residues from via bottoms. As shown in FIG. 5, substrate 500 includes a dual damascene feature that consists of a first dielectric layer 502 having a first dielectric constant, and a second dielectric layer 504 having a second dielectric constant. Substrate 500 may also include etch stop, hard mask, and other layers with different surface characteristics as well, which are not shown here. At the bottom of the trench/via is conductive region 506. As shown in FIG. 5, one or both of dielectric layers 502 and 504 may be low-k dielectric materials, and are therefore at least partially hydrophobic. In addition, one or both layers 502 and 504 may be porous or non-porous. As such, a subsequent aqueous process be inhibited or altogether prevented from reaching conductive region 506 at the bottom of the trench/via due to the repulsive effect on an aqueous solution caused by the hydrophobic nature of the trench/via walls of layers 504 and 502 prior to treatment, especially when the trench/via have a high aspect ratio. To counteract this effect, an amphiphilic layer 508 is formed on both hydrophobic dielectric regions. Thus, amphiphilic layer 508 provides a same or similar wetting angle for all portions of the feature and allows any subsequent aqueous processes to effectively reach conductive region 506 at the bottom of the trench/via. Amphiphilic surface modifier layer 508 may be a PVA layer (optionally removable) or other amphiphilic layers, such as cationic starches, protein compounds, diblock copolymers, triblock copolymers, dendrimers, and amphiphilic macromolecules can be used in any combination, or additionally in combination with PVA.

As described above, the amphiphilic layer 508 will deposit and react with hydrophobic surfaces of the feature to impart a hydrophilic characteristic. If one or more surfaces of the feature are porous, a pore-sealing effect of the amphiphilic layer will also serve to condition the substrate to prevent or minimize diffusion of process molecules through pores in dielectric regions. The use of an amphiphilic layer to change a hydrophobic characteristic of a substrate or of substrate portions can be particularly useful in complex, small scale topographical features where aqueous processes may be prevented from entering and accessing hydrophobic lined trenches/vias, as shown in FIG. 5.

Figure 6:
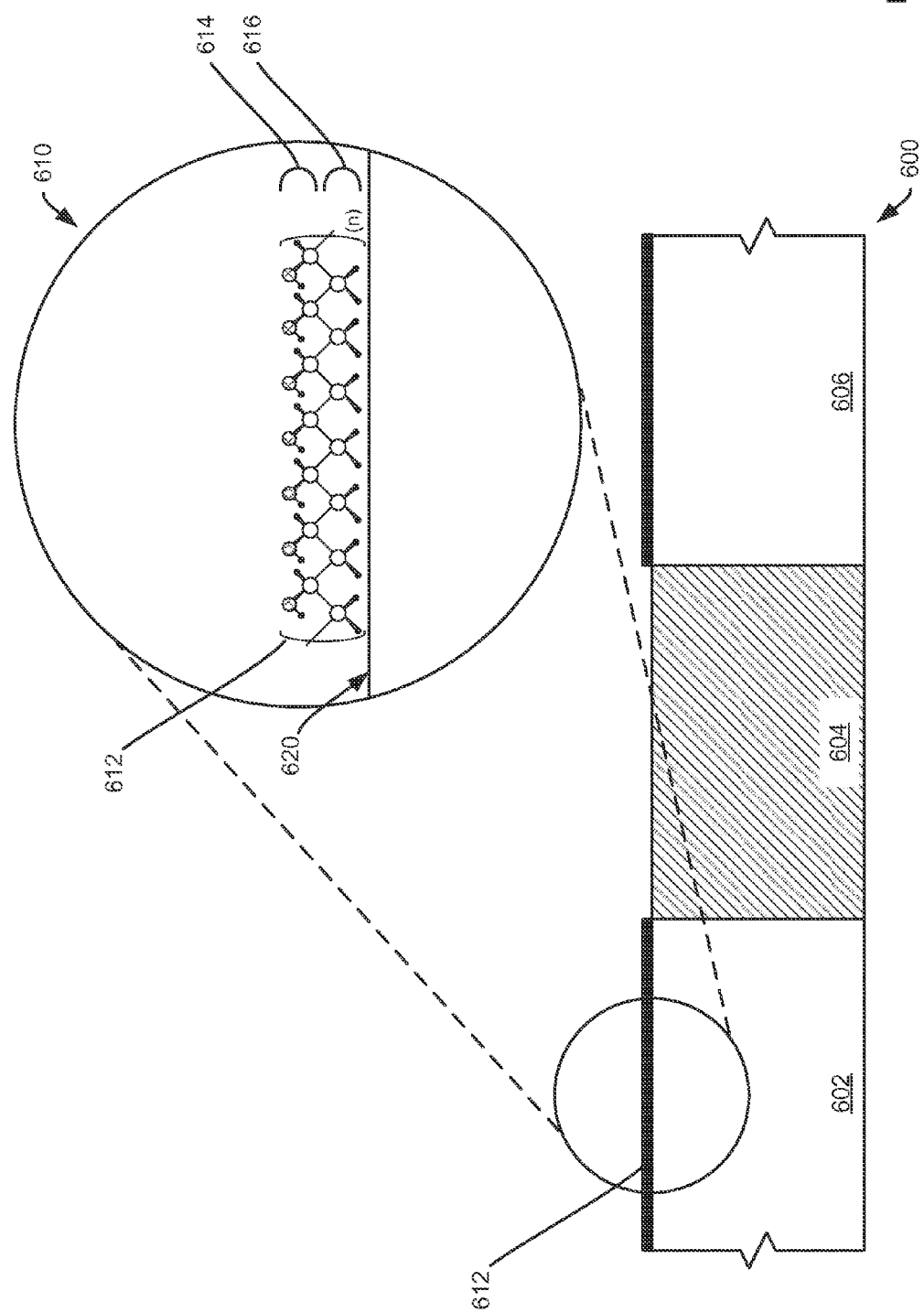
FIG. 6 is an illustrative representation of substrate and an exploded view of an amphiphilic surface modifier layer formed on non-porous low-k dielectric material in accordance with embodiments of the present invention.

FIG. 6 is an illustrative representation of substrate 600 and an exploded view 610 of amphiphilic surface modifier layer 612 formed on non-porous low-k dielectric material 602 in accordance with embodiments of the present invention. Substrate 600 may include any number of dielectric regions 602 and 606 along with conductive region 604, which may be interleaved and configured in any fashion without departing from the present invention. Exploded view 610 particularly illustrates non-porous dielectric surface 620 after treatment utilizing embodiments described herein. As illustrated, amphiphilic surface modifier layer 612 attaches along dielectric surface 620. It may be noted that amphiphilic surface modifier layer 612 may bond with dielectric surface 620 through any theoretically possible means including chemical bonding, physical bonding or any other mechanism or force without departing from the present invention. Thus, dielectric region 602 may be protected while leaving conductive region 604 relatively accessible to process chemistries. As illustrated, amphiphilic surface modifier layer 612 is a monolayer. However, in some embodiments, additional layers may be formed without departing from the present invention. In some examples utilizing aqueous processes, non-porous dielectric materials may suffer from penetration of process chemistry through the dielectric surface, which may adversely alter the dielectric's properties or may cause shorting between conductive regions. When utilizing an amphiphilic surface modifier layer as illustrated, methods are provided which protect dielectric surfaces with a surface modifier, thus allowing aqueous processes to proceed without damaging an underlying porous dielectric material.

Figure 7:
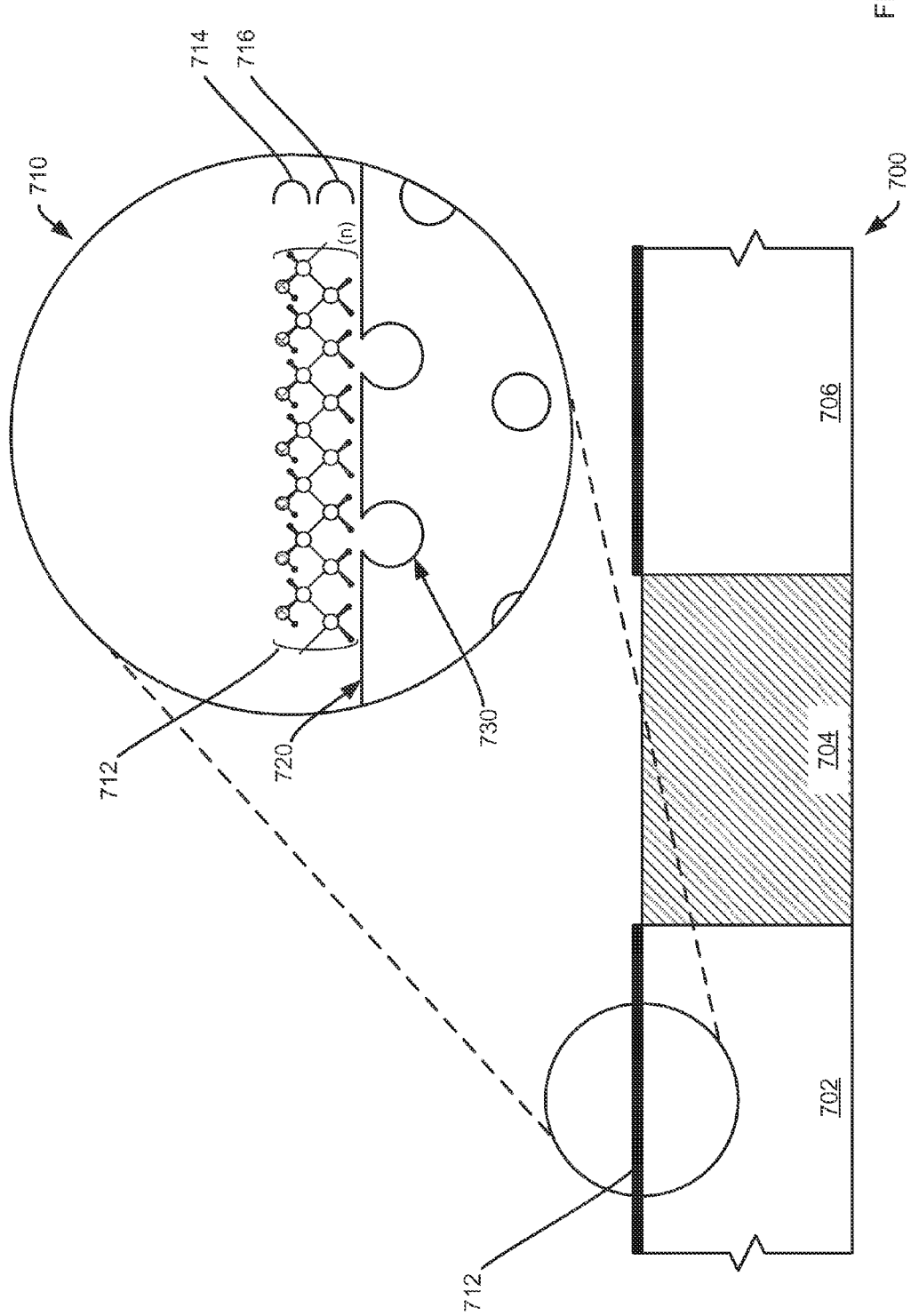
FIG. 7 is an illustrative representation of substrate and an exploded view of an amphiphilic surface modifier layer formed on porous low-k dielectric material in accordance with embodiments of the present invention.

FIG. 7 is an illustrative representation of substrate 700 and an exploded view 710 of amphiphilic surface modifier layer 712 formed on porous low-k dielectric material 702 in accordance with embodiments of the present invention. Substrate 700 may include any number of dielectric regions 702 and 706, along with conductive region 704, which may be interleaved and configured in any fashion without departing from the present invention. Exploded view 710 particularly illustrates dielectric surface 720 after treatment. As illustrated, amphiphilic surface modifier layer 712 attaches along dielectric surface 720. As above, amphiphilic surface modifier layer 712 may bond with dielectric surface 720 through any theoretically possible means including chemical bonding, physical bonding or any other mechanism or force without departing from the present invention. Thus, dielectric region 702 may be protected while leaving conductive region 704 relatively accessible to process chemistries. As illustrated, amphiphilic surface modifier layer 712 is a monolayer (i.e. a single layer of PVA molecules). However, in some embodiments, additional layers may be formed without departing from the present invention. Further, as illustrated, amphiphilic surface modifier layer 712 may be formed over pores 730 which may be present along surface of dielectric region 702. Porous dielectric material may be utilized to reduced undesirable capacitive and cross-talk effects. However, in some examples utilizing aqueous processes, porous dielectric materials may suffer from diffusion of chemistry into the pores, which may adversely alter the dielectric's properties (such as increasing the dielectric constant) or may cause shorting between conductive regions. When utilizing an amphiphilic surface modifier layer as illustrated, methods are provided which cover pores without filling them, thus allowing aqueous processes to proceed without damaging an underlying porous dielectric material. In some embodiments, a size or molecular weight of the amphiphilic surface modifier layer can be chosen depending on the porosity of the dielectric region 702. For example, in one embodiment, a PVA surface modifier layer may include molecular weights ranging from 5 to 500 kiloDaltons (kDa), the particular weight utilized depending on the chosen dielectric material.

Returning to FIG. 2, at block 204 the amphiphilic surface modifier may optionally be cross-linked. In some embodiments, amphiphilic surface modifiers may be modified through cross-linking or similar processes to increase stability of the layer. In addition, in some embodiments, cross-linking may include creating functional handles to allow post-deposition modification. In some embodiments, cross-linking processes may be performed by chemical modification. Chemical modification processes may be facilitated by creation of hydrophilic functional handles as provided by an amphiphilic layer. Cross-linking agents that may be utilized for chemical modification include: a glutaraldehyde solution, a dialdehyde solution, a sulfuric acid ($H_2SO_4$) solution, a maleic acid solution, a citric acid solution, a solution of glutaraldehyde and sulfuric acid, and an ascorbic acid solution without departing from the present invention. In some embodiments, cross-linking processes may be performed by non-chemical modification. Non-chemical modification may include: deep ultra-violet (DUV) cure, ebeam cure, or plasma cure methods without departing from the present invention. In addition, in some embodiments, cross-linking may also change the contact angle of a treated substrate thus further altering the wettability of the treated surface. In some embodiments, cross-linking may affect a thickness of an amphiphilic layer. In addition, in embodiments utilizing PVA, cross-linking of a PVA surface modifier may occur over a selected cross-linking period in the range of approximately 30 to 600 s at a temperature in a range of approximately 25 to 60° C. Layers comprising other amphiphilic compounds may require different cross-linking periods for cross-linking amphiphilic layers.

Cross-linking may provide a more stable amphiphilic surface modifier layer to protect a low-k dielectric surface during subsequent processing. For example, in some applications, where harsh aqueous processes (e.g., high temperature processes) are anticipated or where surfactants are used, cross-linking amphiphilic surface modifiers may provide additional benefits. It has been experimentally determined that cross-linking a PVA surface modifier can protect a low-k dielectric from aggressive surfactants. In addition, cross-linking may also improve the pore-sealing characteristics of an amphiphilic surface modifier by improving barrier properties of the layer.

At a block 205 of FIG. 2, the substrate may optionally be rinsed to remove excess amphiphilic surface modifier and any other contaminants. Rinsing may be accomplished utilizing any method well-known in the art without departing from the present invention. Rinsing may be utilized to clean surfaces of residual particles which may, in some examples, create nucleation sites that promote undesirable deposition. In one embodiment, in order to prevent removal of all PVA surface modifier solution (including PVA surface modifier bound with hydrophobic dielectric material surface), a rinse step may be accomplished utilizing an aqueous solution at a temperature lower than what is required to dissolve PVA. In some embodiments, a PVA surface modifier treated substrate may also be blown dry with, for example, nitrogen ($N_2$) or argon gas. After a rinsing step, PVA surface modifier will have coated hydrophobic surfaces as illustrated in FIG. 2C. In some embodiments, the layer only grows to a certain size (e.g., ~20 to 35 Å), and excess solution does not attach. In such an embodiment, the rinse will remove the excess PVA surface modifier.

At a next block 207 of FIG. 2, an aqueous process is performed on a substrate having an amphiphilic surface modifier layer. Any aqueous process known in the art may be utilized without departing from the present invention including: an electrochemical deposition process, a cleaning process, a pre-chemical mechanical planarization (CMP) cleaning process, a post-CMP cleaning process, a via cleaning process, a contact cleaning process, a trench cleaning process, a metallization process, and an electroless (e-less) deposition process. It may be appreciated that these processes may be selected in any combination to selectively react with conductive regions that are not covered by an amphiphilic surface modifier such as PVA.

In addition, in any of these aqueous processes, surfactants may be utilized to enhance the wettability of the substrate surface. A PVA surface modifier may protect the low-k dielectric materials from damage due to surfactant exposure. For example, a PVA surface modifier formed of a 0.5M solution of PVA compound having a molecular weight in the range of approximately 13 to 23 kDa and being 89% hydrolyzed and applied to a porous low-k dielectric material may be utilized to protect low-k dielectric material from various concentrations of the non-ionic surfactant PEG-PPG-PEG. The PVA surface modifier may be utilized to protect a porous low-k dielectric material from concentrations of greater than 10% PEG-PPG-PEG up to 80% PEG-PPG-PEG.

Figure 3C:
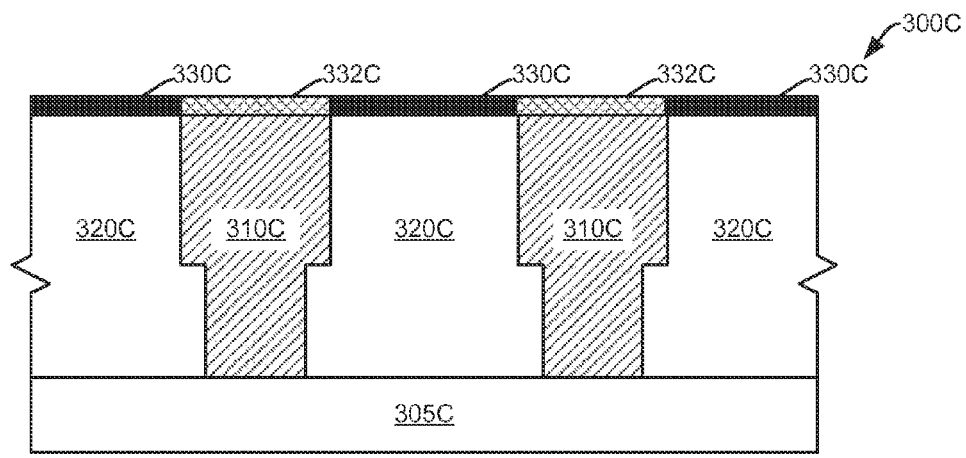

In some embodiments, an aqueous deposition process may include an electroless (e-less) deposition process. E-less deposition is the chemical deposition of a conductive material onto a base material surface by reduction of metal ions in a chemical solution without applying an external electric potential. In some embodiments, e-less deposition is utilized to deposit a capping layer, such as a noble metal (eg. platinum (Pt) or ruthenium (Ru)), a cobalt (Co) layer, a nickel (Ni) layer, or an alloy such as CoWB, CoWPB, CoWP, on a conductive region of a substrate. A capping layer may be utilized to reduce or prevent electromigration from copper or other metallization (e.g., conductive regions 310B, FIG. 3B) into other regions or layers. Using a PVA surface modifier may promote more even growth of a capping layer, improving integration of the capping layer. Referring briefly to FIG. 3C, which is an illustrative cross-sectional representation of surface modified substrate 300C after a wet deposition process in accordance with embodiments of the present invention, when layer 330C is selectively formed on dielectric regions 320B, an aqueous deposition process may be utilized to deposit a capping layer 332C on conductive regions 310C.

As illustrated, substrate 300B may include a base layer 305B, dielectric regions 320B, and conductive regions 310B and 312B. As above, conductive regions 310B and 312B and dielectric regions 320B are formed over base 305B, which may be conductive in some embodiments. As above, conductive regions 310B and 312B may form interconnections between base 305B and other electrically conductive materials subsequently formed as part of substrate 300B. Substrate 300B includes layer 330B, which attaches with dielectric region or surface 320B. Layer 330B may be a PVA surface modifier (optionally removable) or other amphiphilic surface modifiers, such as cationic starches, protein compounds, diblock copolymers, triblock copolymers, dendrimers, and amphiphilic macromolecules can be used in any combination, or additionally in combination with PVA. Layer 330B is preferably an amphiphilic surface modifier used to increase a hydrophilicity of the substrate 300B. In some embodiments, for example layer 330B is very thin, in the range of approximately 5 to 50 Å and preferably within the range of approximately 20 to 35 Å. Therefore, in these embodiments, layer 330B may or may not be removed after subsequent aqueous processing, since a thin layer may not affect further processing or the final semiconductor device. In an embodiment utilizing PVA, a PVA surface modifier may be removed by rinsing a surface of a substrate with a hot water bath or during a hot water rinse process.

Returning to FIG. 2, at a next block 208, an amphiphilic surface modifier may be removed from a substrate in an aqueous rinse step. An amphiphilic surface modifier layer may be generally removed by rinsing a surface of a substrate with a hot water bath or a hot water rinse process. In some embodiments, an aqueous process may remove all or part of an amphiphilic surface modifier layer. However, in embodiments where complete removal is desirable, the method continues to remove all amphiphilic surface modifier. In one embodiment, the removal step consists of soaking or rinsing the substrate in an aqueous solution such as a hot water bath for a specified removal period. In some embodiments utilizing PVA, a removal temperature of an aqueous solution or hot water bath is in the range of approximately 60 to 90° C. and a removal period is approximately 60 s. Layers comprising other amphiphilic compounds may require different temperatures and removal periods for removing an amphiphilic layer from a substrate after aqueous processing. In some embodiments, PVA may be removed in a plasma chamber before a subsequent process (e.g., deposition or pretreatment).

Experimental Results

I. Modifying Surface Characteristics

In some embodiments in which the amphiphilic surface modifier comprises PVA, several specific examples of deposited PVA surface modifiers are described herein. As used herein the term "deposited" and any derivation thereof broadly refers to the formation of a layer or region in any manner known in the art and may include all such manners without departing from the present invention. Such examples are provided for purposes of description only and represent unique instances of certain embodiments.

Experiment 1

Deposited PVA surface modifiers exhibit a reduced contact angle, and therefore increased wettability and improved suitability for aqueous processing. A first example of a deposited PVA surface modifier was formed by depositing three samples (denoted Sample 1, Sample 2, and Sample 3) with each of four different PVA concentrations (25, 100, 250, and 500 mM), using a water deposition (0 mM) as a control.

With these examples, the PVA surface modifier solution was deposited for 120 s, at 25° C. followed by a 60 s deionized water rinse. Each PVA surface modifier solution was a PVA solution having a molecular weight in the range of approximately 13 to 26 kDa and being 99% hydrolyzed. The deposition produced a film having measurable thickness and contact angle parameters. The thickness of the layers was measured using ellipsometry techniques, and the contact angle of the surface was measured to evaluate wettability.

The thickness measurements (in Angstroms) are as follows:

TABLE 1

|  | 0 mM (Water) | 25 mM | 100 mM | 250 mM | 500 mM |
|---|---|---|---|---|---|
| Sample 1 | 8.98 | 23.78 | 27.76 | 31.54 | 34.34 |
| Sample 2 | 6.47 | 23.15 | 25.65 | 31.97 | 34.32 |
| Sample 3 | 5.10 | 23.64 | 30.37 | 31.27 | 33.18 |

As may be seen, compared with the control (water), all PVA surface modifiers show an increase in thickness, indicating that the PVA surface modifier has been deposited.

The contact angle (in degrees) measurements are as follows:

TABLE 2

|  | 0 mM (Water) | 25 mM | 100 mM | 250 mM | 500 mM |
|---|---|---|---|---|---|
| Sample 1 | 67.4 | 39.3 | 36.1 | 36.3 | 33.8 |
| Sample 2 | 80 | 41.5 | 39.6 | 34 | 33.7 |
| Sample 3 | 82.4 | 39.5 | 35.3 | 35.7 | 34.2 |

As may be seen in the above table, all PVA surface modifiers show a substantial contact angle reduction (i.e., an increase in the hydrophilic nature of the substrate) as compared with the control (water). Embodiments of amphiphilic surface modifiers may be utilized with substrates of various topographies and geometries. For example, in a dual damascene structure, a trench/via may be formed within a feature that contains two layers that have different dielectric constants.

FIG. 8A is an illustrative representation of an untreated substrate 800 and accompanying graphical representation of atomic force microscope (AFM) scan 810 for untreated substrate 800 in accordance with embodiments of the present invention. AFM is a very high-resolution type of scanning probe microscope, with demonstrated resolution of fractions of a nanometer. It should be noted that the graphical representation shown is intended for further clarifying and illustrating embodiments of the present invention and does not represent actual data, although the illustrated representation is consistent with experimental data. It should further be noted that illustrations are not necessarily drawn to a particular scale, but are provided for clarity in understanding embodiments described herein. Thus, illustrations provided should not be construed as limiting with respect to scale and proportion As illustrated, untreated substrate 800 may include any number of features 802 (as indicated by cross-hatching) which may, in some examples, be small and isolated with respect to other features, but may densely populate a substrate nevertheless. Features 802 represent a substrate having varying pattern density, or having conductive regions that have varying size and separation. Scan line 806 represents a path of an AFM. AFM scan 810 illustrates a relative height of material deposited over features 802. Reference point 804 is provided for clarity in understanding AFM scan 810. As can be seen, where features are smaller, less material is deposited, though under certain conditions, no material will be deposited on the smaller features. This characteristic deposition pattern may be due in part to hydrophobic characteristics of dielectric portion 808, which may adversely affect aqueous deposition processes like electroless deposition.

FIG. 8B is an illustrative representation of a treated substrate 820 and accompanying graphical representation of AFM scan 830 for treated substrate 820 in accordance with embodiments of the present invention. As above, treated substrate 820 may include any number of features 822 (as indicated by cross hatching) which may, in some examples, be small and isolated with respect to other features, but may densely populate a substrate nevertheless. Scan line 826 represents a path of an AFM. AFM scan 830 illustrates a relative height (i.e., thickness) of deposition over features 822. Reference point 824 is provided for clarity in understanding AFM scan 830. As may be seen for AFM scan 830, deposition rates for all features are more uniformly distributed. Thus, methods provided herein allow small features isolated by dielectric material to be equally processed utilizing aqueous deposition processes. It should be understood that features may also include topography, such as vias or trenches. In those examples, AFM scanning measurements would then relate to the adequacy of the fill of those features.

II. Protecting Dielectric Materials

For embodiments in which the protective coating comprises PVA, several specific examples of deposited PVA layers are described herein. As used herein the term "deposited" and any derivation thereof broadly refers to the formation of a layer or region in any manner known in the art and may include all such manners without departing from the present invention. Such examples are provided for purposes of description only and represent unique instances of certain embodiments.

Experiment 2

Figure 9:
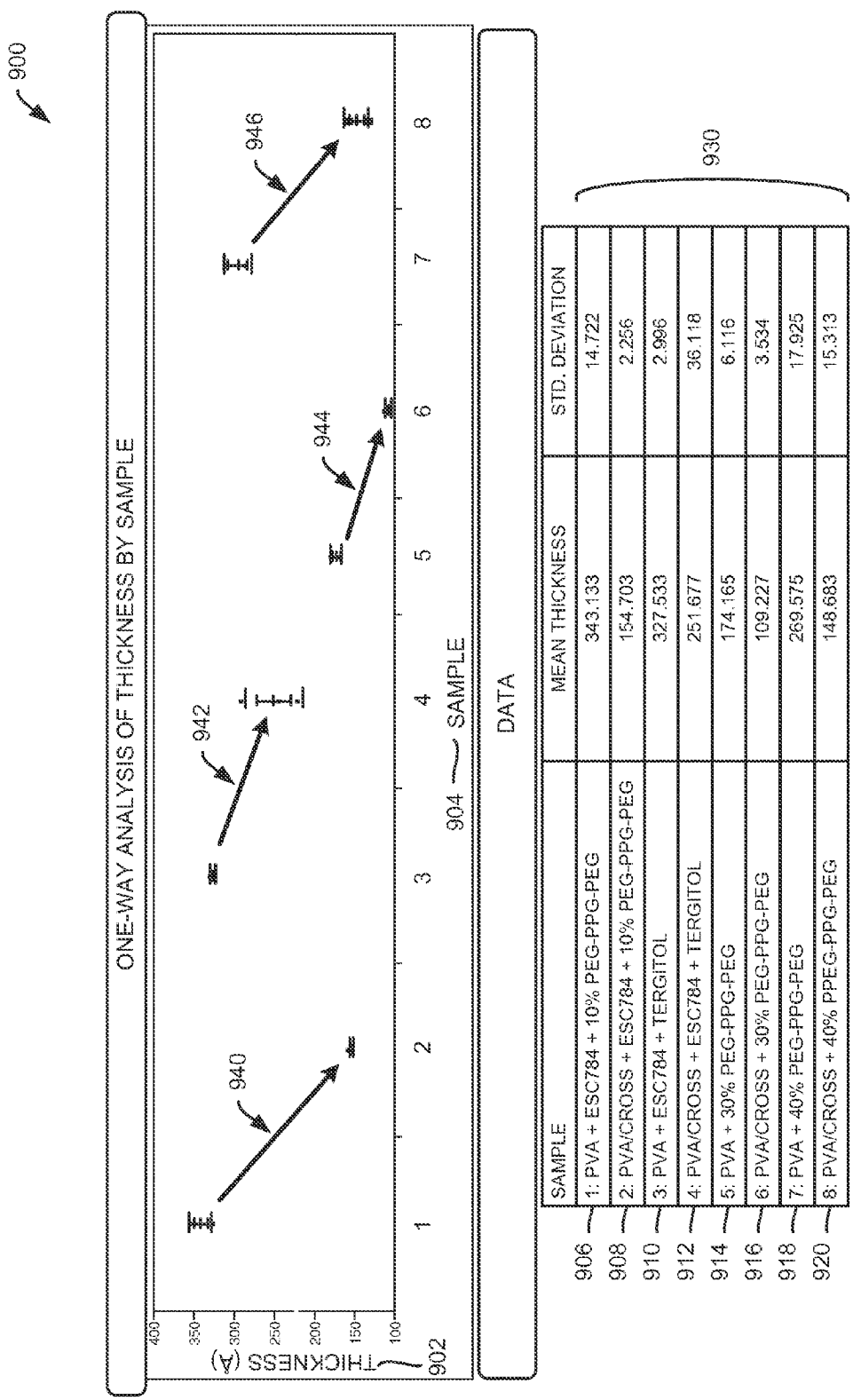
FIG. 9 is an illustrative graphical representation of thickness by sample in accordance with embodiments of the present invention.

Experiment 2 demonstrates that cross-linking of a PVA surface modifier enhances the protection of the low-k dielectric from surfactants. In order to determine whether solutions containing surfactants may be prevented from penetrating a protective coating, another coupon of porous low-k dielectric material was subjected to various conditions. The results are illustrated in FIG. 9, which is an illustrative graphical representation 900 of thickness 902 by sample 904 in accordance with embodiments of the present invention. The samples were as follows:

dielectric+protective coating+cleaning agent+10% PEG-PPG-PEG (906);

dielectric+cross-linked protective coating+cleaning agent+10% PEG-PPG-PEG (908);

dielectric+protective coating+cleaning agent+TERGITOL TMN10 (910);

dielectric+cross-linked protective coating+cleaning agent+TERGITOL TMN10 (912);

dielectric+protective coating+30% PEG-PPG-PEG (914);

dielectric+cross-linked protective coating+30% PEG-PPG-PEG (916);

dielectric+protective coating+40% PEG-PPG-PEG (918); and dielectric+cross-linked protective coating+40% PEG-PPG-PEG (920).

For all samples a protective coating of a 0.05M solution PVA compound having a molecular weight of approximately 13 to 23 kDa and being 89% hydrolyzed was applied to the coupon for approximately 60 s and subsequently rinsed for approximately 60 s. For samples including cross-linking, a 0.075M glutaraldehyde and 0.2M $H_2SO_4$ solution was reacted with coupons at a reaction temperature of approximately 40° C. for a reaction time of approximately 90 s. A non-ionic surfactant composed of PEG-PPG-PEG at various concentrations and TERGITOL TMN10 along with a cleaning agent composed of ESC784 by Advanced Technology Materials Incorporated, of Danbury, Conn. diluted to 1:30 were reacted with the dielectric having a non-cross-linked protective coating and with the dielectric having a cross-linked protective coating in different combinations as noted above. Reaction times were approximately 30 s. As illustrated, the data 930 demonstrates that the cross-linked protective coatings were effective in preventing penetration of all formulations utilizing non-ionic surfactants including, but not limited to: 10% PEG-PPG-PEG, TERGITOL TMN10, 30% PEG-PPG-PEG, and 40% PEG-PPG-PEG as indicated by arrows 940, 942, 944, and 946 respectively.

Experiment 3

Figure 10:
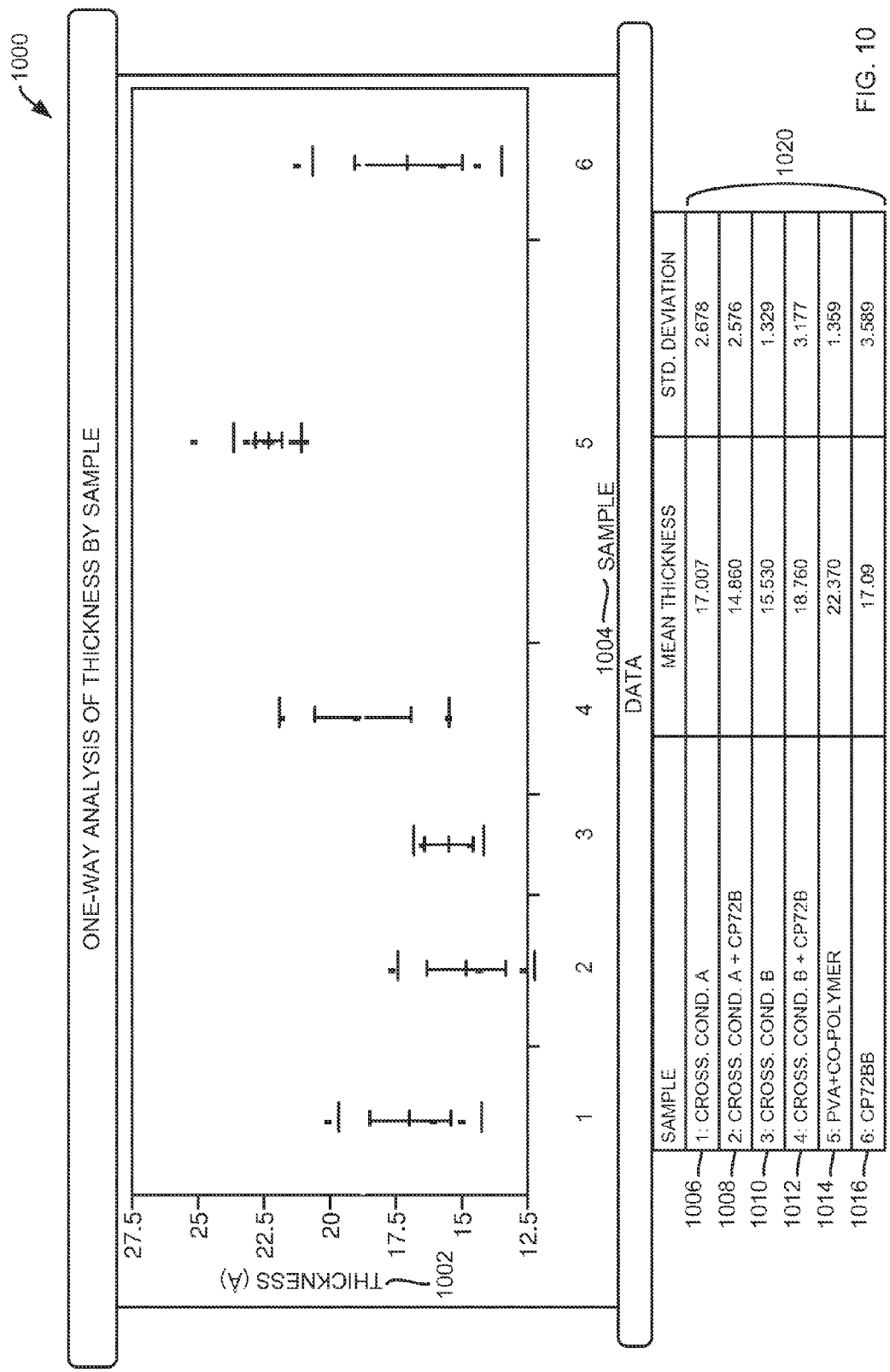
FIG. 10 is an illustrative graphical representation of thickness by sample in accordance with embodiments of the present invention.

Experiment 3 demonstrates that co-polymerization of a PVA surface modifier prevents the degradation of a porous low-k dielectric material in experiments where the co-polymerized PVA surface modifier is cross-linked and where the co-polymerized PVA surface modifier is not cross-linked. A coupon of porous low-k dielectric material was subjected to various conditions. The results are illustrated in FIG. 10, which is an illustrative graphical representation 1000 of thickness 1002 by sample 1004 in accordance with embodiments of the present invention. The samples were as follows:

dielectric+cross-linked (A) protective coating+co-polymer (1006);

dielectric+cross-linked (A) protective coating+co-polymer+CP72B (1008);

dielectric+cross-linked (B) protective coating+co-polymer (1010);

dielectric+cross-linked (B) protective coating+co-polymer+CP72B (1012);

dielectric+protective coating+co-polymer (1014); and dielectic+CP72B (1016).

For samples that include a protective coating, a 98% hydrolyzed PVA-co-siloxane compound was applied to the coupon for approximately 60 s and subsequently rinsed for approximately 60 s. For samples including cross-linking, condition (A) cross-linking was accomplished by rinsing the protective coating with 0.4% HCl for approximately 60 s and subsequently rinsed for approximately 60 s and condition (B) cross-linking was accomplished by rinsing the protective coating with 0.04% HCl for approximately 60 s and subsequently rinsed for approximately 60 s. For samples including washing with CoppeReady CP72B by Air Products and Chemicals, Inc. of Allentown, Pa., which is a non-fluorinated, high performance copper/low-k CMP cleaning solution, the coupon was washed 15 times for approximately 30 s each time and subsequently rinsed for approximately 60 s. As illustrated, the data 1020 demonstrates that the PVA-co-siloxane protective coating survived CP72B treatment without cross-linking Without being bound by theory, it is proposed that the co-polymer complex may form a covalent bond with surface groups on the dielectric material. In some embodiments, other co-polymers may be utilized without limitation including: co-ethylene, co-cation, co-anion (88% hydrolyzed), and co-anion (80% hydrolyzed).

Experiment 4

Figure 11:
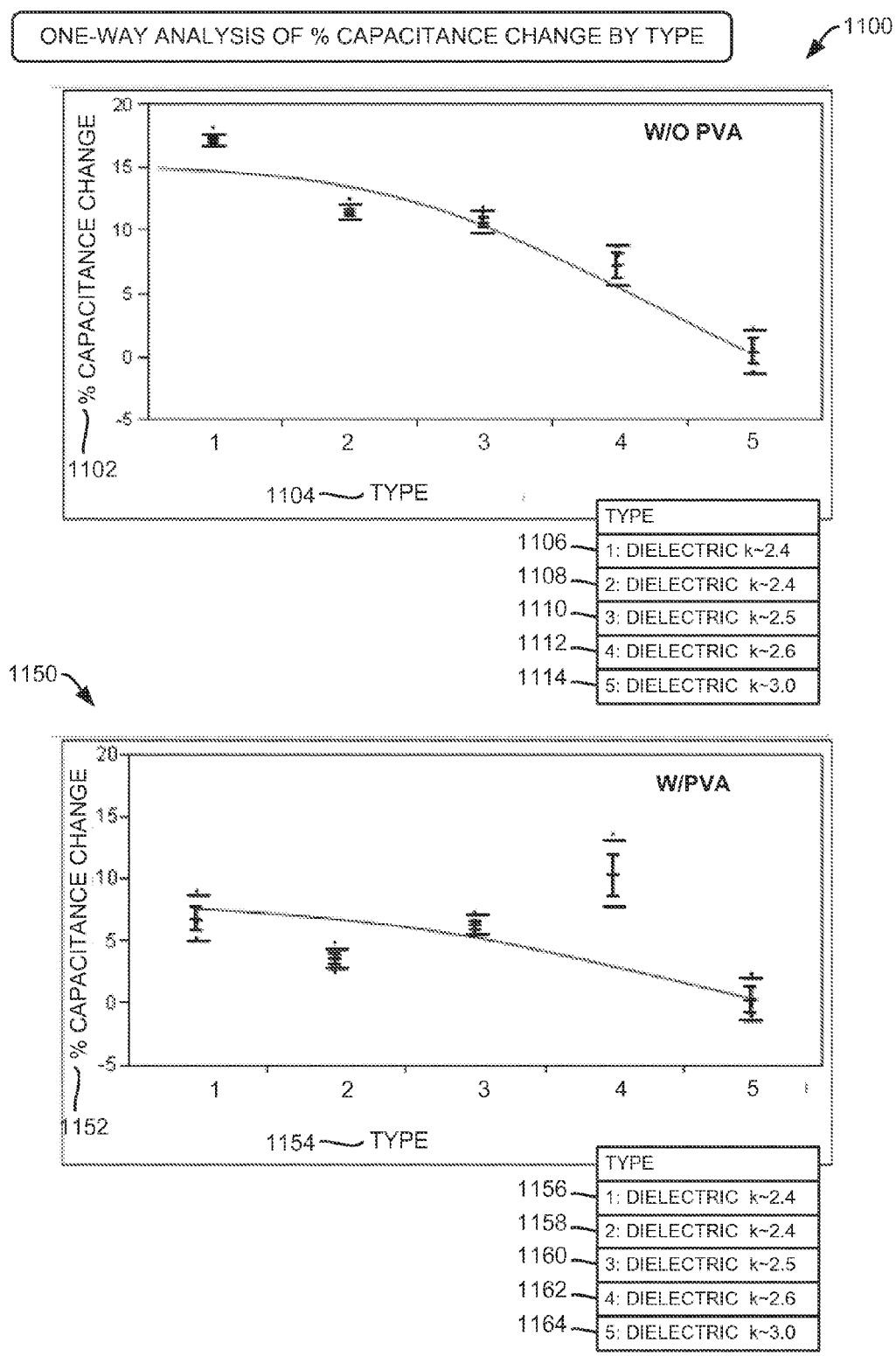
FIG. 11 includes illustrative graphical representations of % capacitance change by type in accordance with embodiments of the present invention.

Experiment 4 demonstrates that a PVA surface modifier can prevent a decrease in dielectric constant of low-k dielectric materials and protect the sometimes more sensitive low-k dielectric materials. In order to determine the effects of protective coatings under embodiments of the present invention, several types of low-k dielectric materials were subjected to a cleaning solution. The results are illustrated in FIG. 11, which includes illustrative graphical representations of % capacitance change by type in accordance with embodiments of the present invention. In graph 1100, the data illustrates % capacitance change 1102 by type 1104 of several low-k dielectric materials namely: dielectric (k~2.4) material 1106, dielectric (k~2.4) material 1108, dielectric (k~2.5) material 1110, dielectric (k~2.6) material 1112, and dielectric (k 3.0) material 1114. The materials were washed with CoppeReady CP72B by Air Products and Chemicals, Inc. of Allentown, Pa., which is a non-fluorinated, high performance copper/low-k CMP cleaning solution for one minute.

In graph 1150, the data illustrates % capacitance 1152 by type 1154 of several protectively coated low-k dielectric materials namely: dielectric (k~2.4) material 1156, dielectric (k~2.4) material 1158, dielectric (k~2.5) material 1160, dielectric (k~2.6) material 1162, and dielectric (k~3.0) material 1164 in accordance with embodiments of the present invention. A 0.05M solution of a PVA compound having a molecular weight of approximately 12 to 25 kDa was applied to the materials whereupon the materials were washed with CP72B for one minute.

In comparing graphs, graph 1150 indicates that a protective coating of a PVA compound is effective in protecting k values of hydrophobic dielectric materials 1156, 1158, and 1160. As may be appreciated, PVA readily adsorbs with hydrophobic surfaces (e.g., dielectric materials 1156, 1158, 1160, and 1164), which may explain these results.

In some embodiments, a substrate may be an electronic device selected from a group consisting of: semiconductor devices, optoelectronic devices, data storage devices, magnetoelectronic devices, magnetooptic devices, molecular electronic devices, photovoltaic devices (e.g., solar cells), flat panel displays, MEMS, electroluminescent devices, photoluminescent devices, photonic devices, and packaged devices.

Embodiments described herein may be utilized to process a substrate made of a variety of material. This is particularly so since the embodiments can be implemented so that substrate material (e.g., a dielectric region) is conditioned to have a particular hydrophilic property. As used herein, conditioning of a material refers to modifying the hydrophilic characteristics of an exposed part of the material to achieve a desired wettability for any subsequent aqueous process. In particular, some embodiments may be utilized to process a semiconductor substrate as is commonly done in the manufacture of components for use in the electronics industry. Embodiments may also be utilized to process a substrate for use in the production of a flat panel display, which substrates are now commonly made of silicon. In addition, embodiments may be utilized to process any type of semiconductor substrate, such as, for example, a silicon substrate, silicon-on-insulator substrate, silicon carbide substrate, strained silicon substrate, silicon germanium substrate or gallium arsenide substrate.

Further, embodiments may be utilized to process a substrate of any shape or size. For example, embodiments may be utilized to process semiconductor substrates utilized in the production of electronic components, which substrates are typically circular, as well as in the processing of substrates utilized in the production of flat panel displays, which substrates are typically rectangular or sheets of solar/photovoltaic cells. Embodiments may be utilized to process small semiconductor substrates having areas of less than approximately one square inch ($in^2$) up to approximately 12 $in^2$ semiconductor substrates currently utilized in the production of many electronic components. In general, there is no limit to the size of substrate that can be processed. Embodiments may also be utilized to process relatively large substrates that are utilized in the production of flat panel displays (now, commonly rectangular substrates on the order of approximately one square meter (m²), but, in some cases, larger) or sheets of solar/photovoltaic cells.

The above description of illustrated embodiments of the substrate processing systems is not intended to be exhaustive or to limit the substrate processing systems to any precise forms disclosed. While this invention has been described in terms of several embodiments, there are alterations, permutations, and equivalents, which fall within the scope of this invention. It should also be noted that there are many alternative ways of implementing the methods and apparatuses of the present invention. Furthermore, unless explicitly stated, any method embodiments described herein are not constrained to a particular order or sequence. Further, the Abstract is provided herein for convenience and should not be employed to construe or limit the overall invention, which is expressed in the claims. It is therefore intended that the following appended claims be interpreted as including all such alterations, permutations, and equivalents as fall within the true spirit and scope of the present invention.

What is claimed is:

1. A semiconductor device comprising:
a substrate;
at least one dielectric region formed above the substrate, the at least one dielectric region having a surface on a side thereof opposite the substrate;
at least one conductive region formed above the substrate adjacent to the at least one dielectric region; and
an amphiphilic surface modifier layer formed on the surface of the at least one dielectric region to increase the hydrophilicity of the surface of the at least one dielectric region,
wherein the amphiphilic surface modifier layer is a polyvinyl alcohol (PVA)-based surface modifier layer, and
wherein the PVA-based surface modifier layer comprises a co-polymer selected from the group consisting of co-ethylene, co-cation, co-siloxane, co-anion (88% hydrolyzed), and co-anion (80% hydrolyzed).

2. The semiconductor device of claim 1, wherein the at least one conductive region has a surface on a side thereof opposite the substrate, wherein the PVA-based surface modifier layer is not formed on the surface of the at least one conductive region.

3. The semiconductor device of claim 1, wherein the PVA-based surface modifier layer has a thickness of between 5 and 50 Angstroms (Å).

4. The semiconductor device of claim 3, wherein the PVA-based surface modifier layer has a thickness of between 20 and 35 Å.

5. The semiconductor device of claim 1, wherein the at least one dielectric region comprises a low-k dielectric material.

6. The semiconductor device of claim 5, wherein the low-k dielectric material comprises at least one of $SiO_2$, SiCN, SiCNH, $SiCH_3$, $SiOCH_3$, SiCOH, porous SiCOH, SiN, SiC, methyl-silsesquioxane (MSQ), SiLK dielectric, parylene, organic low-k polymers, or a combination thereof.

7. The semiconductor device of claim 5, wherein the at least one conductive region comprises at least one of copper, aluminum, a copper-zinc alloy, a copper-calcium alloy, a copper-manganese alloy, or a combination thereof.

8. The semiconductor device of claim 5, wherein the substrate comprises one of a silicon substrate, a silicon-on-insulator substrate, a silicon carbide substrate, a strained silicon substrate, a silicon germanium substrate, or a gallium arsenide substrate.

9. A semiconductor device comprising:
a substrate;
a plurality of low-k dielectric regions formed above the substrate, each of the plurality of low-k dielectric regions having a surface on a side thereof opposite the substrate;
a plurality of conductive regions formed above the substrate, each of the plurality of conductive regions being between and adjacent to two of the plurality of low-k dielectric regions; and
a polyvinyl alcohol (PVA)-based surface modifier layer formed on the surface of each of the plurality of low-k dielectric regions to increase the hydrophilicity of the surface of each of the plurality of low-k dielectric regions,
wherein the PVA-based surface modifier layer comprises a co-polymer selected from the group consisting of co-ethylene, co-cation, co-siloxane, co-anion (88% hydrolyzed), and co-anion (80% hydrolyzed).

10. The semiconductor device of claim 9, wherein the PVA-based surface modifier layer has a thickness of between 5 and 50 Angstroms (Å).

11. The semiconductor device of claim 10, wherein the PVA-based surface modifier layer has a thickness of between 20 and 35 Å.

12. The semiconductor device of claim 9 wherein each of the plurality of conductive regions has a surface on a side thereof opposite the substrate, wherein the PVA-based surface modifier layer is not formed on the surface of each of the plurality of conductive regions.

13. The semiconductor device of claim 12, wherein each of the plurality of low-k dielectric regions comprises at least one of $SiO_2$, SiCN, SiCNH, $SiCH_3$, $SiOCH_3$, SiCOH, porous SiCOH, SiN, SiC, methyl-silsesquioxane (MSQ), SiLK dielectric, parylene, organic low-k polymers, or a combination thereof.

14. The semiconductor device of claim 13, wherein each of the plurality of conductive regions comprises at least one of copper, aluminum, a copper-zinc alloy, a copper-calcium alloy, a copper-manganese alloy, or a combination thereof.

15. The semiconductor device of claim 14, wherein the substrate comprises at least one of a silicon substrate, a silicon-on-insulator substrate, a silicon carbide substrate, a strained silicon substrate, a silicon germanium substrate, or a gallium arsenide substrate.

* * * * *